United States Patent [19]

Miller

[11] Patent Number: 4,675,873
[45] Date of Patent: Jun. 23, 1987

[54] SINGLE MODE INJECTION LASER STRUCTURE

[75] Inventor: Stewart E. Miller, Middletown Township, Monmouth County, N.J.

[73] Assignee: Bell Communications Research, Inc., Livingston, N.J.

[21] Appl. No.: 854,176

[22] Filed: Apr. 21, 1986

Related U.S. Application Data

[62] Division of Ser. No. 655,257, Sep. 28, 1984, Pat. No. 4,639,922.

[51] Int. Cl.[4] .............................................. H01S 3/13
[52] U.S. Cl. .................................... 372/19; 372/29; 372/92; 372/99
[58] Field of Search ..................... 372/92, 20, 99, 19, 372/29

[56] References Cited

U.S. PATENT DOCUMENTS

| | | | |
|---|---|---|---|
| 3,787,779 | 1/1974 | Spitz et al. | 372/99 |
| 3,860,888 | 1/1975 | Stephens | 372/16 |
| 3,902,133 | 8/1975 | Watts | 372/50 |
| 3,959,739 | 5/1976 | Hutcheson et al. | 372/20 |
| 3,965,440 | 6/1976 | Graves | 372/20 |
| 3,967,211 | 6/1976 | Itzkan et al. | 372/32 |
| 4,039,249 | 8/1977 | Kaminow et al. | 350/96.11 |
| 4,054,363 | 10/1977 | Suematsu | 350/96 |
| 4,092,659 | 5/1978 | Ettenberg | 372/49 |
| 4,174,504 | 11/1979 | Chenausky et al. | 372/11 |
| 4,187,475 | 2/1980 | Wieder | 372/31 |
| 4,216,440 | 8/1980 | Rahn et al. | 372/20 |
| 4,425,648 | 1/1984 | Holly | 372/20 |

OTHER PUBLICATIONS

R. Ludeke et al, "Tunable GaAs Laser in An External Dispersive Cavity", Appl. Phys. Lett., vol. 20, No. 12, Jun. 15, 1972, pp. 499–500.

"Tunable Optical Waveguide Directional Coupler Filter", by R. C. Alferness and R. V. Schmit, Appl. Phys. Lett., vol. 33, No. 15, Jul. 1978, pp. 161–163.

"Integrated Optics", edited by T. Tamir, published by Springer Verlag, Topics in Applied Physics, vol. 7, 1982, pp. 19–25.

"Room-Temperature CW Operation of 1.6 Micron GaInAsP/InP Buried-Heterostructure Integrated Laser with Butt-Jointed Built-In Distributed-Bragg-Reflection Waveguide", by Y. Abe, K. Kishino, T. Tanbunek, S. Arai, F. Koyama, K. Matsumoto, T. Watanaba, Y. Suematsu, Electronic Letters, vol. 18, No. 10, May 13, 1982, pp. 410–411.

"1.5–1.6 Micron GaInAsP/InP Dynamic-Single-Model (DSM) Lasers with Distributed Bragg Reflector", by F. Koyama, Y. Suematsu, S. Arai and T. Tawee, IEEE J. Quantum Electronics, vol. QE-19, No. 6, Jun. 1983, pp. 1042–1051.

Primary Examiner—James W. Davie
Attorney, Agent, or Firm—James W. Falk; Stephen M. Gurey

[57] ABSTRACT

The present invention pertains to an injection laser which advantageously suppresses mode-partition-noise. The laser comprises a laser cavity with a gain or active material and means for providing a small amplitude wavelength selective loss. In one embodiment of the present invention the means for providing a small amplitude loss is a wavelength selective reflector.

7 Claims, 1 Drawing Figure

SINGLE MODE INJECTION LASER STRUCTURE

This is a division of application Ser. No. 655,257, filed Sept. 28, 1984, now U.S. Pat. No. 4,639,922 issued Jan. 27, 1987.

BACKGROUND OF THE INVENTION

This invention relates to the field of lasers and more specifically to the field of injection lasers.

Present silica-based optical fibers can be fabricated to have a loss in the 1.3–1.6 micron wavelength region which is an order of magnitude lower than the loss occurring at the 0.85 micron wavelength of present lightwave communications systems, e.g., ¼ db/km versus 2–3 db/km. Furthermore, these fibers can be fabricated to have a transmission delay distortion in the 1.3–1.6 micron wavelength region which is two orders of magnitude lower than the transmission delay distortion at 0.85 microns, e.g., 1–2 ps/km nm versus 100+ ps/km nm. Thus, the dispersion-limited transmission distance for high bit rate lightwave communications systems can be maximized by using a single-frequency, i.e., single-longitudinal-mode, injection laser generating output at the 1.55 micron wavelength where the fibers have minimum loss. For these reasons, present efforts in the development of lightwave communications systems are aimed at the wavelength region between 1.3 and 1.6 microns instead of at the wavelength region surrounding 0.85 microns.

InGaAsP injection lasers produce output in the desired 1.3–1.6 micron wavelength region. However, typical single-resonator InGaAsP injection lasers have a laser cavity length in the 250–300 micron range. This results in mode spacing between 6 and 9 Angstroms. Since the gain spectral width of InGaAsP injection lasers is approximately 250–300 Angstroms, there are more than 30 longitudinal modes under the gain spectral width of a 250 micron long laser. Thus, the gain difference between modes is small and mode discrimination between the main mode and side modes is poor in InGaAsP injection lasers.

The injection laser, like all other oscillators, is perturbed by internal random processes which cause its output to fluctuate. One example of this, known as mode-partition-noise, is the fluctuation at turn-on in the relative intensities of various laser modes while the total output power of the laser remains fixed. Mode-partition-noise is a consequence of random fluctuations in the photon densities of the various modes at the moment lasing threshold is reached. If the main mode photon density is not the largest at that instant, another mode will build up first. In a communication system employing such a laser, mode-partition-noise can combine with dispersion in the transmission medium to produce random distortion of the received signal, thereby degrading system performance. Since the distribution of mode partition fluctuations is exponential rather than Gaussian, fluctuations large enough to cause bit error to occur result in intolerably high rates. For example, the main mode intensity drop-out due to the mode partition fluctuations can be related to the error rate in the following way. If the laser is modulated with a bit rate equal to the main mode intensity drop-out duration (approximately 1 nanosecond), about half of the drop-out events will cause error in a system with high dispersion. Thus, a drop-out rate of 1 per second will cause an error rate of $10^{-9}$ at 1 Gbit/s. Furthermore, because mode partition fluctuations are a low-frequency phenomena, lasting a few nanoseconds, they cannot be reduced by averaging in high-bit-rate (1000-MB/s) systems.

Mode-partition-noise is inherent in any laser with more than one resonant mode, e.g., the typical InGaAsP injection laser described above, and can be expected to some degree in all conventional Fabry-Perot lasers. However, the mode-partition-noise impairment does not exist when an ideal single-longitudinal-mode (SLM) laser is used, because all the power produced by the SLM laser exists in only one mode. However, in practice, there are always unwanted vestigial side modes in any laser and SLM lasers can only be approximate.

Several structures, aimed at providing single-frequency operation, have been proposed and demonstrated. These include distributed feedback (DFB) and distributed Bragg reflector (DBR) lasers, lasers with an external cavity, injection-locking lasers, short-cavity lasers and coupled-cavity lasers. Unfortunately, these laser structures are either difficult to fabricate, difficult to operate or require external elements which are sensitive to mechanical vibration.

SUMMARY OF THE INVENTION

Advantageously, the present invention substantially eliminates mode-partition-noise in injection lasers by preferentially suppressing laser action in modes other than the main longitudinal mode of the laser cavity.

An injection laser fabricated in accordance with the teachings of the present invention comprises a laser cavity with a gain or active material and means for providing small amplitude wavelength selective loss. In an embodiment of the present invention, the means for providing small amplitude loss is a wavelength selective reflector having a value of reflectivity at the wavelength of the main mode that is less than 10% higher than its reflectivity values at the wavelengths of modes other than the main mode.

BRIEF DESCRIPTION OF THE DRAWING

A complete understanding of the present invention may be gained from a consideration of the following detailed description taken in conjunction with the accompanying drawing, in which.

DETAILED DESCRIPTION

Figure 1:
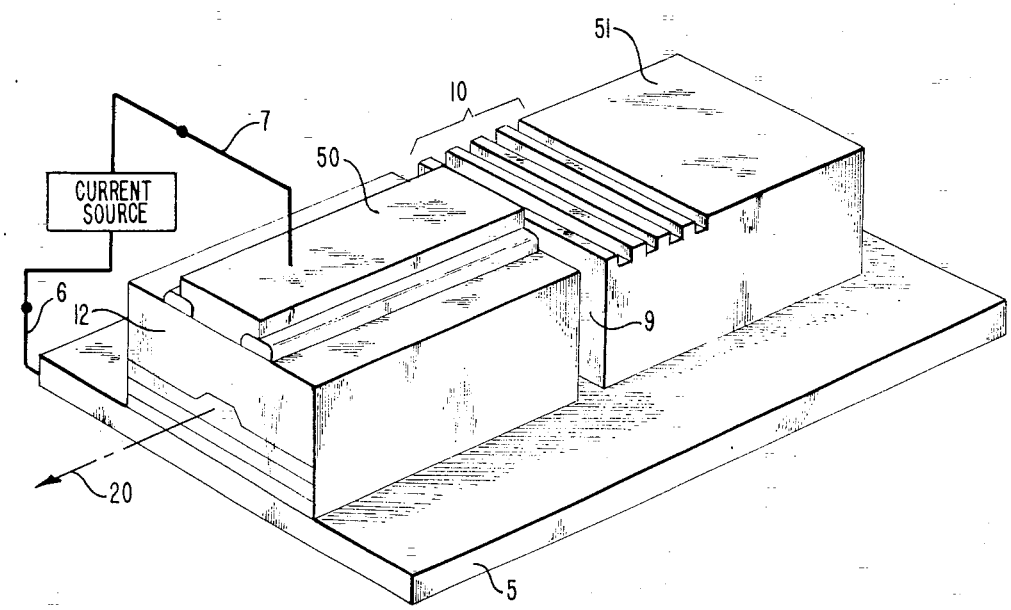
FIG. 1 shows, in pictorial form, an embodiment of the present invention in which a grating is used to provide wavelength selective loss.

Embodiments of the present invention comprise injection lasers having means for providing wavelength selective loss. The loss is greater at the wavelength of the side modes as compared to that at the wavelength of the main mode. More importantly, I have discovered, contrary to the present understanding in the art, that very small loss differences can have a dramatic effect in reducing side mode levels and thereby reducing fluctuations which cause mode-partition-noise.

Previous workers in this field have not been aware of the surprisingly large effect such small loss-differentials can have. For example, the equilibrium side mode level in a 500 micron long simple Fabry-Perot laser is about 8.5 to 1 at the 1.6 mW power level when both facet reflectivities are 0.3. This side mode level is raised to 139 to 1 by increasing the reflectivity at one end of the laser cavity to 0.31 at the main mode wavelength. Table I shows the results of further calculations, considering 17 total modes, for a structure having a cavity length of 500 microns and being pumped with a current density, J, equal to 1.03 ka/cm$^2$.

TABLE 1

| Main Mode Reflectivity | Side Mode Reflectivity | Main Mode to Side Mode | Main Mode Power Output (mW) |
|---|---|---|---|
| .30 | .30 | 8.5 | 1.418 |
| .31 | .30 | 139 | 1.845 |
| .32 | .30 | 270 | 1.904 |
| .35 | .30 | 658 | 1.987 |
| .40 | .30 | 1286 | 2.124 |
| .90 | .30 | 6621 | 2.783 |

As the table readily shows, main mode output increases sharply for reflectivity differences of less than 10% between the main mode and the side modes. In particular, a small increase in main mode reflectivity from 0.30 to 0.31 increases main mode output from 1.418 mW to 1.845 mW. This represents a transfer of laser output from side modes to the main mode.

This transfer has further advantages. First, embodiments of the present invention reduce laser output fluctuations when operating in a continuous mode, i.e., constant injection current. This reduces mode-partition-noise in lightwave communications systems using fibers having wavelength dispersion.

Second, embodiments of the present invention also improve the laser transient response to the leading edge of pulses in a pulse code modulation (PCM) system. Specifically, as the current density, J, in an injection laser is increased to its value at threshold, a ringing occurs in the output which results from an oscillatory interaction between photon density and carrier density. The mean of the oscillatory output at turn-on grows with an exponential-like waveform. I have discovered that a small wavelength selective loss dramatically reduces the turn-on-time, i.e., the time for the laser output to reach steady state in the main mode. For example, in the case of a 500 micron laser, the turn-on time can be reduced by a factor of ten, i.e., from 10 nanoseconds to less than one nanosecond, for a mere 2% change in reflectance. As a result, a lightwave communications system employing a laser embodying the principles of the present invention can advantageously permit the speed of the transmitted pulse stream to be increased by a factor of ten.

Specifically, embodiments of the present invention comprise an active material disposed in a laser cavity and means for providing wavelength selective loss. The loss element can be a separate structure that is appended to the active material. Furthermore, one laser can provide a multiplicity of output wavelengths while using the same active material. In this instance, the response of the wavelength selective loss element must be changed in order to suppress the unwanted wavelengths—either electrically, through an effect such as the electro-optical effect, acoustically, through the acousto-optic effect or physically, through appending a different element to the device.

FIG. 1 shows an embodiment of the present invention where reflection grating 10 provides small amplitude wavelength selective loss by means of wavelength selective reflections. Active laser section 50 is known in the art as a ridge-type laser structure. As shown, it has simple cleaved ends and smooth internal layers. The laser output from the structure is transmitted along the direction shown by arrow 20. Layer 5 is a heat sink. Contacts 6 and 7 serve as electrical contacts for applying injection current to active laser section 50. Gap 9 between the end of active laser section 50 and the beginning of reflector 51 can be non-existent, i.e., the two structures may be butted together. Reflector 51, containing reflection grating 10, can be fabricated separately from active laser section 50. Reflector 51 may be fabricated from a number of different materials. For example, reflector 51 can be a LiNbO$_3$ layer. When reflector 51 is fabricated from LiNbo$_3$, metallic contacts may be deposited thereon in order to apply a voltage therebetween and create an electric field in the reflector. This field, in turn, permits the index of refraction to be varied by means of the electro-optic effect. Alternatively, reflector 51 can be a fused silica layer. Such a layer has a low temperature coefficient and thereby provides enhanced stability of the structure. Since the reflection vs. wavelength pattern of the grating depends on the index of refraction of the material, stabilization of the index of refraction stabilizes the oscillation frequency of the laser.

Although active laser section 50 is shown as a ridge-type laser, any other laser type could be used. The active laser section merely supplies gain over the total line width of the semiconductor used. The frequency of operation, within that line width, is then selected, varied and stabilized in accordance with the properties of reflector 51.

Laser output face 12 may be a simple cleaved facet. Alternatively, it may be coated to decrease its reflection coefficient. A moderate decrease or increase in reflectivity could be used to optimize the laser output power. An accurate antireflection coating could alternatively be used to produce a superluminescent diode wherein the spectral width and peak transmission wavelength are both determined by the characteristics of reflector 51.

Another embodiment of the present invention, not shown in the drawings, is obtained when a series of layers of material having alternating value of index of refraction is substituted for reflector 51 in the embodiment shown in FIG. 1. The values of the indexes of refraction are chosen to give a reflection peak at one wavelength. The fabrication of multilayer coatings for forming laser mirrors is well known in the art. Usually, in the art, a very large ratio of peak to side level reflectance is required, but embodiments of the present invention utilize my discovery that substantial advantage may be obtained from small differences in reflectivity. Although the multilayer reflector needs as sharp a reflectance peak as can be conveniently produced to suppress side modes in a long laser, it need not have large peak-to-side mode reflectance values.

Alternate structures to obtain wavelength selective loss are described in the parent application Ser. No. 655,257, filed Sept. 28, 1984 and now U.S. Pat. No. 4,639,922 issued Jan. 27, 1987. Other embodiments of the present invention may be devised by those skilled in the art without departing from the spirit and scope of the present invention.

What is claimed is:

1. An injection laser which comprises:
   an active laser region having a first end which is a partial reflector of laser radiation generated in the active laser region,
   means for injection pumping the active laser region to produce laser radiation, a first separate laser partial reflector of the laser radiation disposed to form a laser cavity between the first end and the first separate laser partial reflector, the laser cavity having a main mode, wherein the first separate laser partial reflector has a value of reflectivity at the wavelength of the main mode that is less than 10% higher than its reflectivity values at the wavelengths of modes than the main mode.

2. An injection laser which comprises:

an active laser region, means for injection pumping the active laser region to produce laser radiation, first and second separate partial reflectors of the laser radiation disposed on either side of the active laser region to form a laser cavity therebetween and having a main mode, wherein the first separate partial reflector has a value of reflectivity at the wavelength of the main mode that is less than 10% higher than its reflectivity values at the wavelengths of modes other than the main mode.

3. The injection laser claimed in accordance with claims 1 or 2 wherein the first separate partial reflector is a multilayered dielectric.

4. The injection laser claimed in accordance with claims 1 or 2 wherein the first separate partial reflector is a grating.

5. The injection laser claimed in accordance with claim 4 wherein the grating is formed in $LiNbO_3$.

6. The injection laser claimed in accordance with claim 5 wherein the first separate partial reflector further comprises metal electrodes disposed across the grating and a variable source of voltage applied across the electrodes whereby a variable electric field is applied to the grating.

7. The injection laser claimed in accordance with claim 4 wherein the grating is formed in fused silica.

* * * * *

UNITED STATES PATENT AND TRADEMARK OFFICE
CERTIFICATE OF CORRECTION

PATENT NO.   :   4,675,873

DATED        :   June 23, 1987

INVENTOR(S)  :   Stewart E. Miller

It is certified that error appears in the above-identified patent and that said Letters Patent is hereby corrected as shown below:

Column 2, line 48, ";" should read --.--.

Column 4, line 9, "LiNbo$_3$" should read --LiNbO$_3$--.

Column 5, line 8, after "modes" insert --other--.

Signed and Sealed this

Fifth Day of January, 1988

Attest:

DONALD J. QUIGG

Attesting Officer

Commissioner of Patents and Trademarks